(12) United States Patent
Zhuang et al.

(10) Patent No.: US 12,191,339 B2
(45) Date of Patent: Jan. 7, 2025

(54) LIGHT EMITTING DIODE AND MANUFACTURING METHOD THEREFOR

(71) Applicant: HCP TECHNOLOGY CO., LTD., Dongguan (CN)

(72) Inventors: Wenrong Zhuang, Dongguan (CN); Ming Sun, Dongguan (CN); Xiaochao Fu, Dongguan (CN); Jingquan Lu, Dongguan (CN)

(73) Assignee: HCP TECHNOLOGY CO., LTD., Dongguan (CN)

( * ) Notice: Subject to any disclaimer, the term of this patent is extended or adjusted under 35 U.S.C. 154(b) by 107 days.

(21) Appl. No.: 17/441,123

(22) PCT Filed: Jun. 10, 2020

(86) PCT No.: PCT/CN2020/095308
§ 371 (c)(1),
(2) Date: Sep. 20, 2021

(87) PCT Pub. No.: WO2021/174716
PCT Pub. Date: Sep. 10, 2021

(65) Prior Publication Data
US 2022/0406964 A1    Dec. 22, 2022

(30) Foreign Application Priority Data
Mar. 3, 2020    (WO) ............... PCT/CN2020/077588

(51) Int. Cl.
*H01L 33/06* (2010.01)
*H01L 27/15* (2006.01)
(Continued)

(52) U.S. Cl.
CPC ........ *H01L 27/156* (2013.01); *H01L 33/0075* (2013.01); *H01L 33/0093* (2020.05);
(Continued)

(58) Field of Classification Search
None
See application file for complete search history.

(56) References Cited

U.S. PATENT DOCUMENTS 7,279,716 B2    10/2007  Chen
2005/0230673 A1  10/2005  Mueller et al.
(Continued)

FOREIGN PATENT DOCUMENTS

CN    1277461 A    12/2000
CN    1601764 A    3/2005
(Continued)

OTHER PUBLICATIONS

International Search Report, PCT/2020/095309, search report mailed Dec. 1, 2020.
(Continued)

*Primary Examiner* — Bilkis Jahan
(74) *Attorney, Agent, or Firm* — CM Law; Stephen J. Weed (57) ABSTRACT

Disclosed are a light emitting diode and a method for manufacturing a light emitting diode. The light emitting diode includes a first-type layer, a light emitting layer, a second-type layer and an electrode layer; the first-type layer includes a first-type gallium nitride; the light emitting layer is located on the first-type layer; the light emitting layer includes a quantum point; the second-type layer is located on the light emitting layer; the second-type layer includes a second-type gallium nitride or an indium tin oxide; and the electrode layer is located on the second-type layer.

9 Claims, 6 Drawing Sheets

(51) Int. Cl.
  *H01L 33/00* (2010.01)
  *H01L 33/58* (2010.01)
  *H01L 33/32* (2010.01)
  *H01L 33/42* (2010.01)

(52) U.S. Cl.
  CPC .............. *H01L 33/06* (2013.01); *H01L 33/58* (2013.01); *H01L 33/32* (2013.01); *H01L 33/42* (2013.01)

(56) References Cited

U.S. PATENT DOCUMENTS

| | | | |
|---|---|---|---|
| 2008/0067539 | A1 | 3/2008 | Shakuda |
| 2009/0152529 | A1 | 6/2009 | Chua et al. |
| 2010/0065811 | A1* | 3/2010 | Senes .............. B82Y 20/00 257/13 |
| 2010/0225858 | A1 | 9/2010 | Dong et al. |
| 2011/0168970 | A1 | 7/2011 | Salcic et al. |
| 2011/0291071 | A1* | 12/2011 | Kim .............. H10K 50/115 438/34 |
| 2013/0042527 | A1* | 2/2013 | Aikala .............. H01L 33/06 977/774 |
| 2013/0146837 | A1* | 6/2013 | Shen .............. H01L 33/42 438/22 |
| 2013/0328010 | A1* | 12/2013 | Yu .............. H01L 33/42 438/47 |
| 2014/0239340 | A1* | 8/2014 | Fujimori .............. H01L 33/40 438/22 |
| 2015/0188009 | A1* | 7/2015 | Chih .............. H01L 33/0095 438/39 |
| 2015/0263218 | A1 | 9/2015 | Miller |
| 2015/0263226 | A1* | 9/2015 | Huang .............. H01L 33/32 257/13 |
| 2016/0218141 | A1 | 7/2016 | Cai |
| 2018/0062041 | A1* | 3/2018 | Nakanishi .............. H01L 33/14 |
| 2018/0233537 | A1 | 8/2018 | Liu et al. |
| 2018/0351034 | A1 | 12/2018 | Kuo et al. |
| 2019/0051801 | A1* | 2/2019 | Seo .............. H01L 33/405 |

FOREIGN PATENT DOCUMENTS

| | | |
|---|---|---|
| CN | 1612365 A | 5/2005 |
| CN | 1414644 A | 4/2006 |
| CN | 101859817 A | 10/2010 |
| CN | 102110752 A | 6/2011 |
| CN | 102231422 A | 11/2011 |
| CN | 102237461 A | 11/2011 |
| CN | 102583228 A | 7/2012 |
| CN | 102916097 A | 2/2013 |
| CN | 103346154 A | 10/2013 |
| CN | 203250777 U | 10/2013 |
| CN | 103427049 A | 12/2013 |
| CN | 104465929 A | 3/2015 |
| CN | 104934460 A | 9/2015 |
| CN | 105047771 A | 11/2015 |
| CN | 106449913 A | 2/2017 |
| CN | 106707607 A | 5/2017 |
| CN | 107591431 A | 1/2018 |
| CN | 107861181 A | 3/2018 |
| CN | 108878618 A | 11/2018 |
| CN | 109004078 A | 12/2018 |
| CN | 109599467 A | 4/2019 |
| CN | 110211497 A | 9/2019 |
| CN | 110441956 A | 11/2019 |
| CN | 110471569 A | 11/2019 |
| CN | 209947852 U | 1/2020 |
| CN | 110823845 A | 2/2020 |
| JP | 2014131041 A | 7/2014 |
| KR | 1020110112221 A | 10/2011 |
| KR | 20120045120 A | 5/2012 |
| KR | 20160086603 A | 7/2016 |
| KR | 101700792 B1 | 1/2017 |
| TW | 201015752 A | 4/2010 |
| WO | 2019027820 A1 | 2/2019 |
| WO | 2019071362 A1 | 4/2019 |

OTHER PUBLICATIONS

International Search Report, PCT/2020/077588, search report mailed Dec. 4, 2020.
European Search Report of EP20922485, dated Nov. 24, 2022. pp. 1-8.
Translated Japanese Office Action, dated Sep. 27, 2022, pp. 1-5.
Office Action received in U.S. Appl. No. 17/442,278 dated Jan. 5, 2024, 18 pages.
Search Report received in European Application No. 2092487.2-1211 dated Dec. 7, 2022, 16 pages.
First CN Office Action for application 202080007265.8.
First CN Office Action for application 202080009048.2.
European Search Report PCT/CN2020/077588, dated Sep. 1, 2022.

* cited by examiner

LIGHT EMITTING DIODE AND MANUFACTURING METHOD THEREFOR

CROSS REFERENCE TO RELATED APPLICATIONS

This is a National Stage Application filed under 35 U.S.C. 371 based on International Patent Application No. PCT/CN2020/095308, filed on Jun. 10, 2020, which claims priority to International Patent Application PCT/CN2020/077588 filed on Mar. 3, 2020, disclosures of both of which are incorporated herein by reference in their entireties.

TECHNICAL FIELD

Embodiments of the present application relate to the field of semiconductor technology, and for example a light emitting diode and a method for manufacturing the light emitting diode.

BACKGROUND

In a development process of the display technology, performance improvements in following aspects such as a large size, energy consumption, a response speed, a color gamut, a resolution, brightness, reliability have been pursued. In the related display technologies, a liquid crystal display (LCD) has size advantages and is popular on a large scale. An organic light emitting diode (OLED) has also found large-scale applications in small-sized displays such as a cell phone and a tablet due to advantages of the energy consumption, the color gamut, and a flexibility, however, has not found large-scale popularities in large-sized displays such as a television due to cost and the reliability.

In next generation of display technologies, there are two light emitting devices that have good application prospects, one light emitting device is a Micro LED and one light emitting device is a quantum dot light emitting diode (QLED). The Micro LED has advantages in terms of brightness, a contrast ratio, a response speed, a color gamut, a service life, energy consumption and the like. However, the Micro LED has poor consistency in terms of optical and electrical characteristics under the influence of epitaxy and chip processes. Due to a narrow bandwidth emission of a quantum dot, the active display of an electroluminescent device applying the quantum dot, especially a large-size commercial quantum dot, is also a promising display technology. The QLED serves as a most basic unit in the active display of the quantum dot, has been extensively studied in recent years for better color quality and efficiency, and overall performance of the QLED has steadily improved over the past few years.

However, in related light emitting technologies of the quantum dot, whether photoluminescence or electroluminescence, it is difficult to avoid the impact of water vapor and oxygen on the performance and lifetime of the quantum dot.

SUMMARY

Embodiments of the present application provide a light emitting diode and a method for manufacturing the light emitting diode, so as to improve the optical and electrical consistency of the light emitting diode and enhance the capability of isolating water vapor and oxygen of the light emitting diode.

In a first aspect, an embodiment of the present application provides a light emitting diode. The light emitting diode includes a first-type layer, a light emitting layer, a second-type layer and an electrode layer. The first-type layer includes a first-type gallium nitride. The light emitting layer is located on the first-type layer and includes a quantum dot. The second-type layer is located on the light emitting layer and includes a second-type gallium nitride. The electrode layer is located on the second-type layer.

In a second aspect, an embodiment of the present application provides a method for manufacturing a light emitting diode. The method for manufacturing a light emitting diode includes: a first-type substrate is provided, where the first-type substrate includes a base and a first-type layer, and the first-type layer includes a first-type gallium nitride; a light emitting layer is formed on the first-type layer of the first-type substrate, where the light emitting layer includes a quantum dot; a second-type layer is formed on the light emitting layer, where the second-type layer includes a second-type gallium nitride; and an electrode layer is formed on the second-type layer.

In a third aspect, an embodiment of the present application further provides a light emitting diode. The light emitting diode includes a first-type layer, a light emitting layer, a second-type layer and an electrode layer. The first-type layer includes a first-type gallium nitride. The light emitting layer is located on the first-type layer and includes a quantum dot. The second-type layer is located on the light emitting layer and includes an indium tin oxide. The electrode layer is located on the second-type layer.

In a fourth aspect, an embodiment of the present application further provides a method for manufacturing a light emitting diode. The method for manufacturing a light emitting diode includes: a first-type substrate is provided, where the first-type substrate includes a base and a first-type layer, and the first-type layer includes a first-type gallium nitride; a light emitting layer is formed on the first-type layer of the first-type substrate, where the light emitting layer includes a quantum dot; a second-type layer is formed on the light emitting layer, where the second-type layer includes an indium tin oxide; and an electrode layer is formed on the second-type layer.

DETAILED DESCRIPTION

Figure 1:
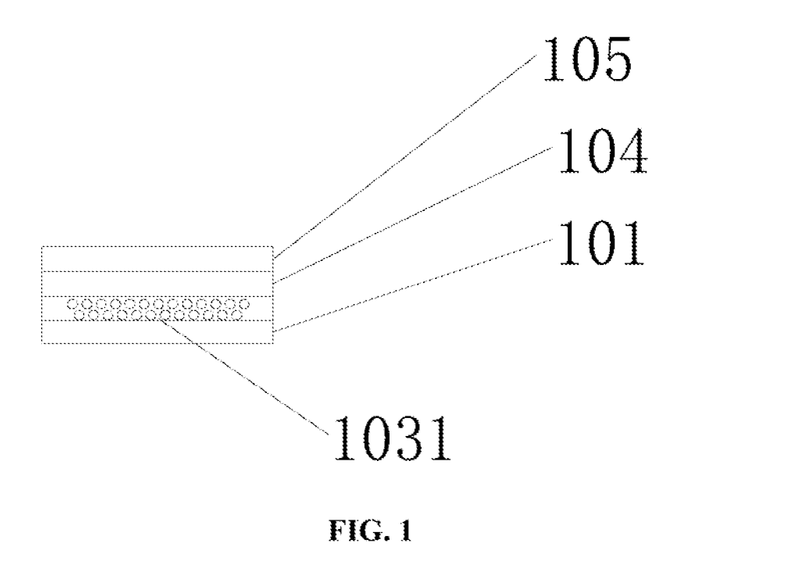
FIG. 1 is a schematic structural diagram of a light emitting diode provided in an embodiment of the present application.

Embodiments of the present application provide a light emitting diode. FIG. 1 is a schematic structural diagram of a light emitting diode provided in an embodiment of the present application. Referring to FIG. 1, the light emitting diode includes a first-type layer 101, a light emitting layer, a second-type layer 104, and an electrode layer 105. The first-type layer 101 includes a first-type gallium nitride. The light emitting layer is located on the first-type layer 101. The light emitting layer includes a quantum dot 1031. The second-type layer 104 is located on the light emitting layer. The second-type layer 104 includes a second-type gallium nitride or an indium tin oxide (ITO). The electrode layer 105 is located on the second-type layer 104.

The first-type gallium nitride may be in a form of a first-type gallium nitride single crystal thin film or a first-type gallium nitride polycrystalline thin film. The quantum dot 1031 include zinc sulfide, zinc selenide, zinc telluride, cadmium sulfide, cadmium selenide, cadmium telluride, mercury sulfide, mercury selenide, mercury telluride, or core-shell nanostructures thereof; or, the quantum dot 1031 includes cadmium selenide-zinc sulfide, cadmium sulfide-zinc sulfide, cadmium sulfide-zinc selenide, cadmium sulfide-zinc selenide, graphene, and the like. As can be seen from the light emitting property of the quantum dot 1031, a light emitting color of the quantum dot 1031 is determined by a size of the quantum dot 1031. The second-type gallium nitride or the ITO in the second-type layer 104 may be formed by adopting a low temperature deposition process, which is conductive to ensuring that a light emitting layer formed by the quantum dot 1031 is not damaged by a high temperature. The ITO may also be formed by adopting a magnetron sputtering process, which is also conductive to ensuring that the light emitting layer formed by the quantum dot 1031 is not damaged by the high temperature. The electrode layer 105 may include, for example, a transparent conductive oxide such as ITO, AZO (aluminum-doped zinc oxide), BZO (boron-doped zinc oxide), which is conducive to ensuring a light extracting rate of the light emitting diode. Exemplarily, the electrode layer 105 may be formed by adopting the low temperature deposition process, which is conductive to ensuring that the light emitting layer formed by the quantum dot 1031 is not damaged by the high temperature.

Therefore, according to the embodiments of the present application, the second-type layer 104 is arranged on the light emitting layer, so that the second-type layer 104 covers the light emitting layer. In this way, on one hand, the second-type layer 104 has a good sealing effect on the quantum dot 1031, which is conductive to avoiding the erosion of water vapor and oxygen to the light emitting layer, and therefore to improving the service life and the performance of the quantum dot 1031; and on the other hand, the second-type gallium nitride or the ITO in the second-type layer 104 may be formed by adopting the low temperature deposition process, which is conductive to ensuring that the light emitting layer formed by the quantum dot 1031 is not damaged by the high temperature. In addition, a main body of the light emitting layer is the quantum dot 1031, and a light emitting wavelength of the light emitting layer is only determined by the size of the quantum dot 1031, which is conductive to improving the optical and electrical consistency of the light emitting diode. Therefore, in the embodiments of the present application, not only the optical and electrical consistency of the light emitting diode is improved, but also the erosion of the water vapor and the oxygen to the light emitting layer and the damage of a high-temperature environment to the light emitting layer is avoided, thereby the performance of the light emitting diode is improved.

Figure 2:
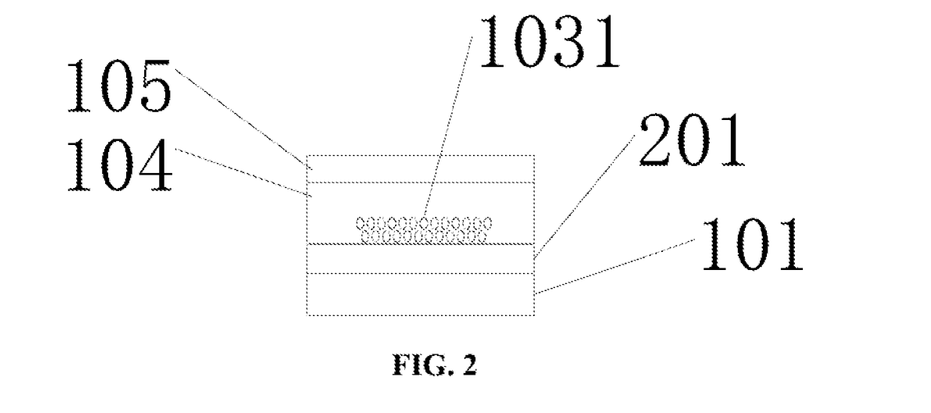
FIG. 2 is a schematic structural diagram of another light emitting diode provided in an embodiment of the present application.

It should be noted that FIG. 1 exemplarily shows that the light emitting layer includes a single quantum dot layer, and is not a limitation of the present application. In other embodiments, as shown in FIG. 2, the light emitting layer may also be arranged to include a composite structure of a superlattice quantum well layer 201 and a quantum dot layer. The quantum dot layer is located between the superlattice quantum well layer 201 and the second-type layer 104, and the light emitting layer is arranged to include the superlattice quantum well layer 201, so that mixing of light of multiple colors is facilitated.

In an embodiment, the light emitting layer may emit white light or monochromatic light, and the monochromatic light may for example be red light, green light or blue light.

For a condition that the light emitting layer includes a single-layer quantum dot layer, a light emitting color of the light emitting layer is determined by the quantum dot layer, and the single-layer quantum dot layer emits at least one of the red light, the green light or the blue light. In a case where the single-layer quantum dot layer only includes a red quantum dot, the light emitting layer emits the red light; in a case where the single-layer quantum dot layer only includes a green quantum dot, the light emitting layer emits the green light; in a case where the single-layer quantum dot layer only includes a blue quantum dot, the light emitting layer emits the blue light; and in a case where the single-layer quantum dot layer includes mixed red, green and blue quantum dots, the light emitting layer emits the white light.

For a condition that the light emitting layer includes the composite structure of the superlattice quantum well layer 201 and the quantum dot layer, a light emitting color of the light emitting layer is determined by the superlattice quantum well layer 201 and the quantum dot layer together. Exemplarily, in a case where the superlattice quantum well layer 201 emits the blue light, and the quantum dot layer emits at least one of the red light or the green light; in a case where the superlattice quantum well layer 201 emits the blue light, and the quantum dot layer includes mixed red and green quantum dots, the light emitting layer emits the white light.

In an embodiment, a thickness of the second-type layer 104 is in a range of 20 nm to 300 nm. In this way, on one hand, the effect of isolating water vapor and oxygen by the second-type layer 104 is avoided from being affected due to a fact that the thickness of the second-type layer 104 is thin; on the other hand, the epitaxial growth time is avoided from being prolonged due to a fact that the thickness of the second-type layer 104 is thick; that is, on the basis of ensuring that the second-type layer 104 isolates the water vapor and the oxygen, and meanwhile the production efficiency is ensured.

In an embodiment, a thickness of the quantum dot layer is in a range of 2 nm to 20 μm.

Figure 3:
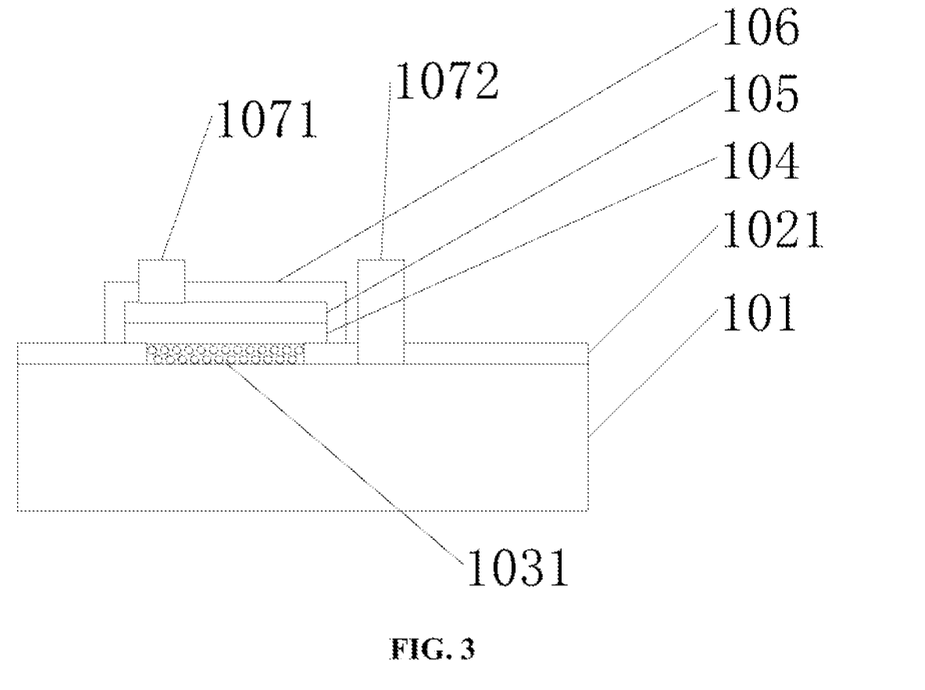
FIG. 3 is a schematic structural diagram of yet another light emitting diode provided in an embodiment of the present application.

On the basis of the above embodiments, an embodiment of the present application further provides a light emitting diode with other structures. FIG. 3 is a schematic structural diagram of yet another light emitting diode provided in an embodiment of the present application. Referring to FIG. 3, in an embodiment of the present application, the light emitting diode further includes a black matrix 1021 and an insulating layer 106. The black matrix 1021 is located between the first-type layer 101 and the second-type layer 104. The black matrix 1021 includes a first window within which the light emitting layer is located. The insulating layer 106 covers an upper surface of the electrode layer 105, a side surface of the electrode layer 105, and a side surface of the second-type layer 104.

The black matrix 1021 plays a role in light shielding and sealing. The first window in the black matrix 1021 is arranged to accommodate the light emitting layer, the first window is a preset area filled with the light emitting layer, and the first window exposes the first-type layer 101 at the bottom so that the light emitting layer is in contact with the first-type layer 101. In an embodiment, a thickness of the black matrix 1021 is greater than a thickness of the light emitting layer to facilitate the sealing of the light emitting layer. The insulating layer 106 may be a film layer having an insulating function or a film layer having both an insulating function and a reflective function, and exemplarily, the insulating layer 106 includes a single-layer reflective layer or a distributed Bragg reflective layer. According to the embodiments of the present application, the sealing performance of the light emitting diode is improved.

Referring to FIG. 3, in an embodiment, the light emitting diode further includes a first electrode 1071 and a second electrode 1072. The insulating layer 106 includes a second window, and the black matrix 1021 includes a third window. The first electrode 1071 is located within the second window, and the second electrode 1072 is located within the third window. The first electrode 1071 may be an anode, the second electrode 1072 may be a cathode, and the first electrode 1071 and the second electrode 1072 may provide voltage and current for the light emitting diode, and the two electrodes may have the same or different materials and structures. Exemplarily, the first electrode 1071 and the second electrode 1072 are configured in a coplanar manner, that is, surfaces of the first electrode 1071 and the second electrode 1072 are consistent in height, so that the bonding of the light emitting diode and a driving circuit board is facilitated, and thus the bonding difficulty of the light emitting diode is reduced.

Figure 4:
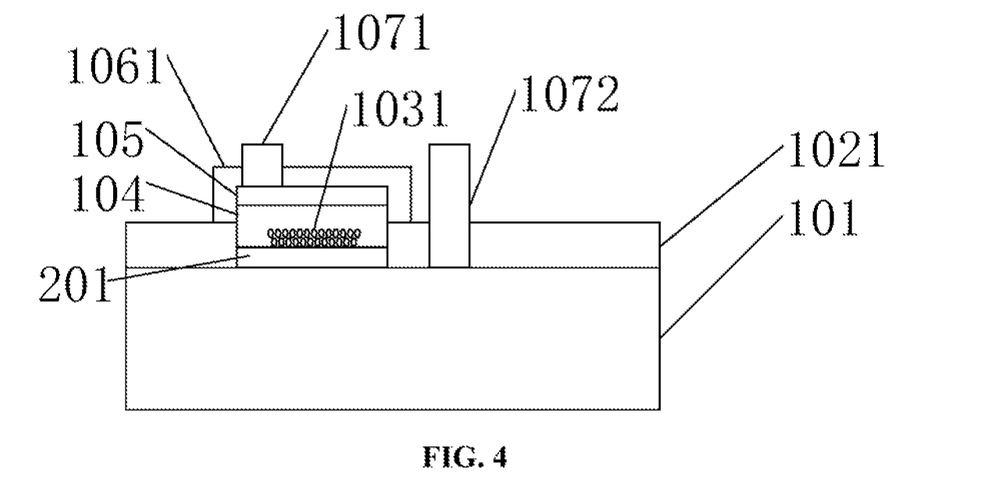
FIG. 4 is a schematic structural diagram of yet another light emitting diode provided in an embodiment of the present application.

FIG. 4 is a schematic structural diagram of yet another light emitting diode provided in an embodiment of the present application. Referring to FIG. 4, unlike FIG. 3, the light emitting layer in FIG. 4 includes the composite structure of the superlattice quantum well layer 201 and the quantum dot layer.

Figure 5:
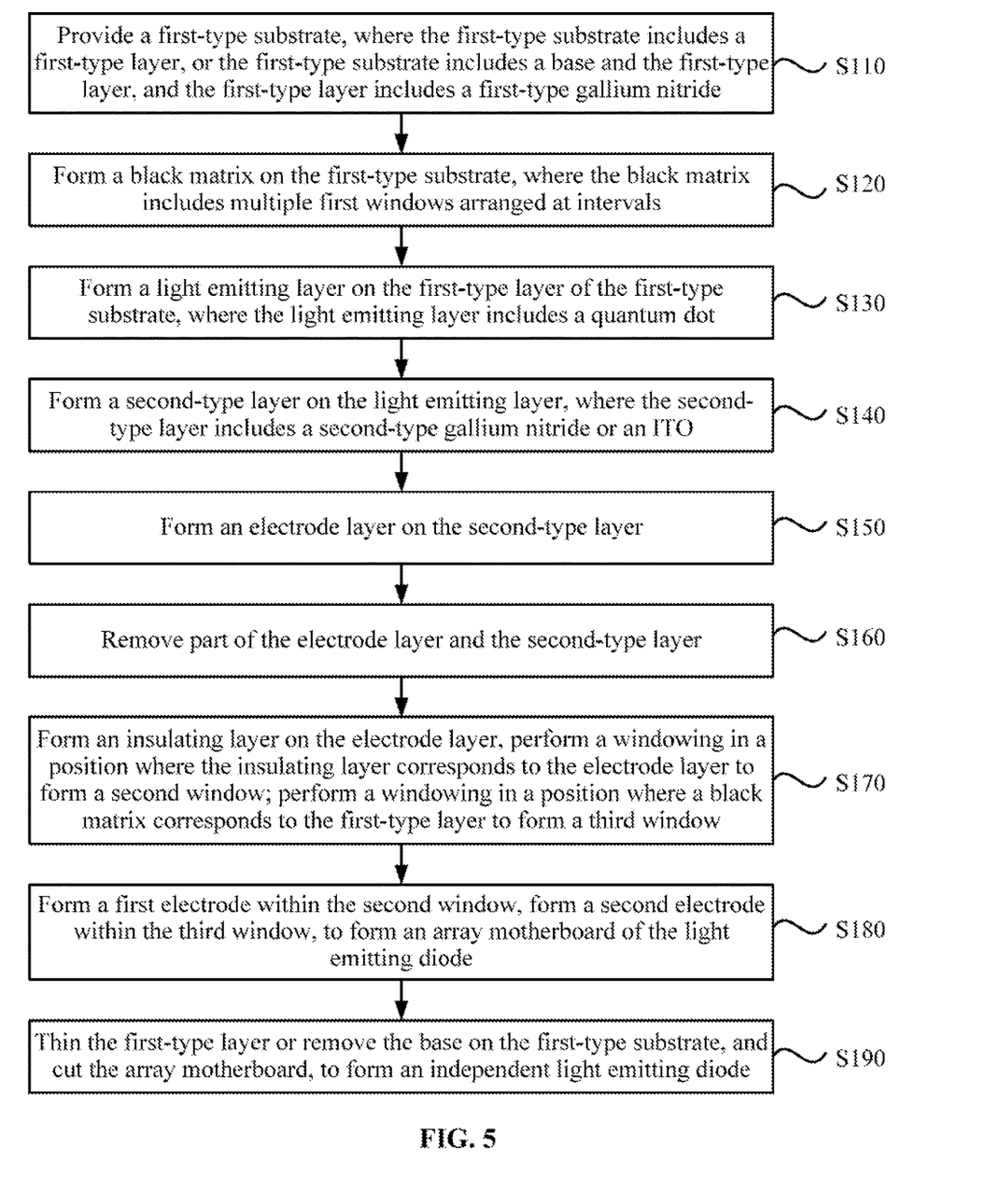
FIG. 5 is a schematic flowchart of a method for manufacturing a light emitting diode provided in an embodiment of the present application.
Figure 6:
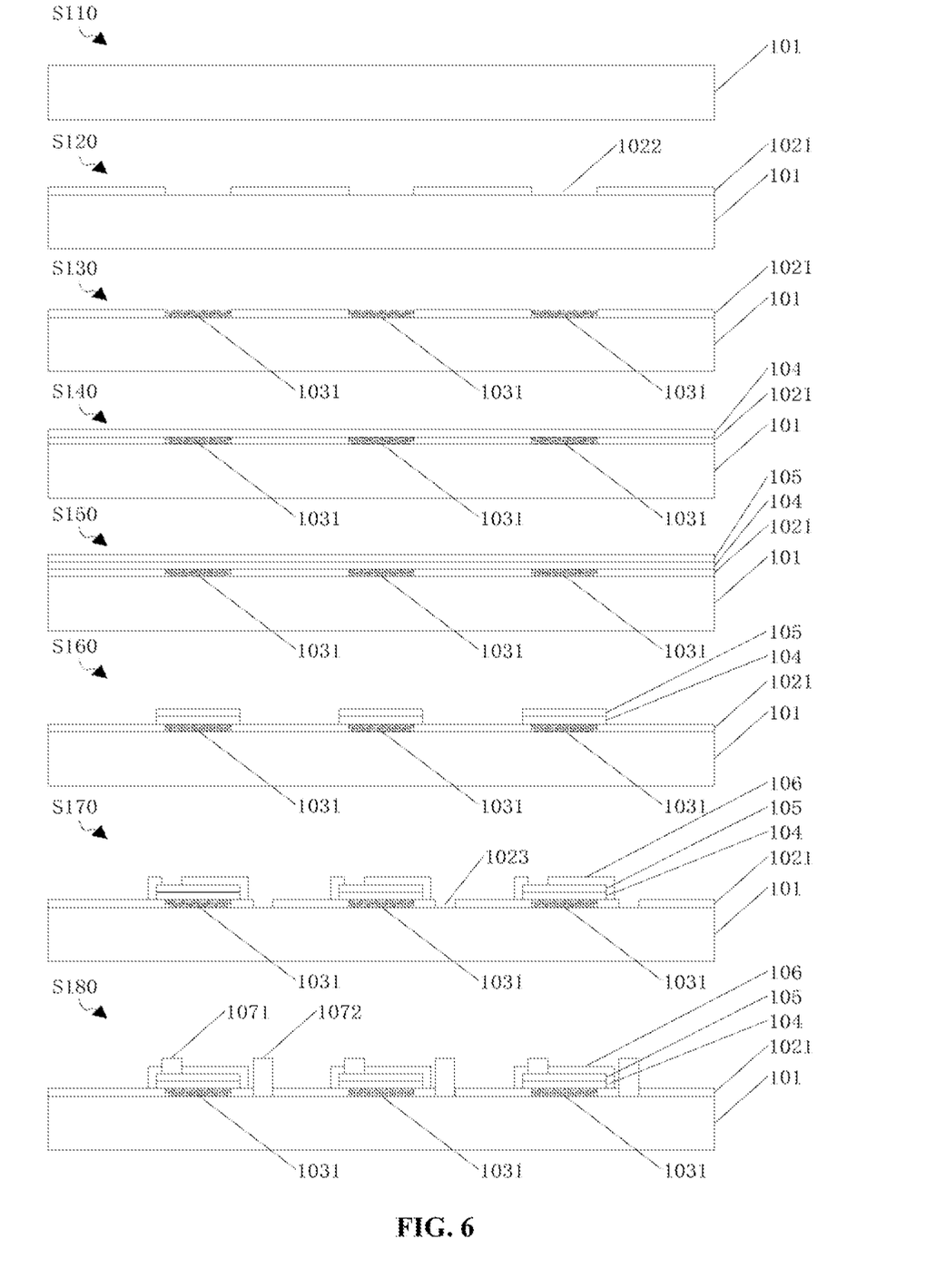
FIG. 6 is a schematic structural diagram of a light emitting diode formed in each step of the method for manufacturing a light emitting diode in FIG. 5.

An embodiment of the present application further provides a method for manufacturing a light emitting diode. FIG. 5 is a schematic flowchart of a method for manufacturing a light emitting diode provided in an embodiment of the present application, and FIG. 6 is a schematic structural diagram of a light emitting diode formed in each step of the method for manufacturing a light emitting diode in FIG. 5. Referring to FIGS. 5 and 6, the method for manufacturing this light emitting diode includes steps S110 to S190.

In step S110, a first-type substrate is provided, where the first-type substrate includes a first-type layer, or the first-type substrate includes a base and the first-type layer, and the first-type layer includes a first-type gallium nitride.

In a case where a film layer thickness of the first-type layer is larger than a preset value, the first-type substrate only includes the first-type layer, and exemplarily, the first-type substrate may be a first-type single crystal gallium nitride film layer manufactured through a hydride vapor phase epitaxy (HVPE) method; in a case where the film layer thickness of the first-type layer is less than or equal to the preset value, the first-type substrate includes the base and the first-type layer, the base is arranged to support the first-type layer, and exemplarily, the first-type substrate may include a composite structure of the base and a first-type gallium nitride single crystal thin film; or the first-type substrate may include a composite structure of the base and a first-type gallium nitride polycrystalline thin film. The base may, for example, include glass, sapphire, silicon, silicon carbide, this base may be removed in a subsequent step; and the first-type gallium nitride single crystal thin film or the first-type gallium nitride polycrystalline thin film may be deposited by a metal-organic chemical vapor deposition (MOCVD).

In step S120, a black matrix is formed on the first-type substrate, where the black matrix includes multiple first windows 1022 arranged at intervals.

A material of the black matrix 1021 may be, for example, silicon dioxide, silicon nitride, a single-layer of Cr, a multi-layer structure composed of Cr and CrOx, a multi-layer structure composed of CrOxNy and CrNy, a multi-layer structure composed of Si and SiOx, or a black resin. The black matrix 1021 plays a role in light shielding and sealing, and a first window 1022 in the black matrix 1021 exposes the first layer 101, and the first window 1022 is arranged to accommodate the light emitting layer. Exemplarily, a process of forming the black matrix 1021 is that: a material including the silicon oxide or the silicon nitride is formed on the first-type substrate through a plasma enhanced chemical vapor deposition (PECVD) process so as to form a material layer of the black matrix 1021; then, the material layer of the black matrix 1021 is etched through a photolithography process to form the multiple first windows 1022 arranged at intervals so as to form the black matrix 1021. Or, a process of forming the black matrix 1021 is that: a material containing the single-layer of Cr, the multi-layer structure composed of Cr and CrOx, the multi-layer structure composed of CrOxNy and CrNy, or the multi-layer structure composed of Si and SiOx is formed on the first-type substrate through a sputtering process or an evaporation process, so as to form a material layer of the black matrix 1021; then, the material layer of the black matrix 1021 is etched through a photolithography process to form the multiple first windows 1022 arranged at intervals so as to form the black matrix 1021. Or, a process of forming the black matrix 1021 is that: a material containing the black resin is formed on the first-type substrate through a spin coating process or a spraying process, so as to form a material layer of the black matrix 1021; then, the material layer of the black matrix 1021 is etched through a photolithography process to form the multiple first windows 1022 arranged at intervals so as to form the black matrix 1021.

In step S130, a light emitting layer is formed on the first-type layer of the first-type substrate, where the light emitting layer includes a quantum dot.

The light emitting layer may be formed within the first window 1022, so that a side surface of the light emitting layer is coated with the black matrix 1021, the sealing of the light emitting layer is facilitated, and the sealing performance of the light emitting diode is improved. In an embodiment, a thickness of the light emitting layer is less than a thickness of the black matrix 1021 to facilitate the sealing of the light emitting layer. As can be seen from the light emitting property of the quantum dot 1031, a light emitting color of the quantum dot 1031 is determined by a size of the quantum dot 1031. Exemplarily, as shown in FIG. 6, the light emitting layer includes a single-layer quantum dot layer, and a process of forming the light emitting layer may be, for example, that: a red quantum dot, a green quantum dot, or a blue quantum dot is provided; and the single-layer quantum dot layer is formed on the first-type layer 101 through at least one of a spin coating process, a printing process, a transfer printing process or a physical vapor deposition process. The light emitting layer thus formed emits monochromatic light. Or, a process of forming the light emitting layer may be, for example, a red quantum dot, a green quantum dot, and a blue quantum dot are mixed, and the single-layer quantum dot layer is formed on the first-type layer 101 through at least one of a spin coating process, a printing process, a transfer printing process or a physical vapor deposition process. The light emitting layer thus formed emits white light.

In step S140, a second-type layer is formed on the light emitting layer, where the second-type layer includes a second-type gallium nitride or an ITO.

A process of forming the second-type layer 104 may be a low temperature deposition process, and exemplarily including a plasma assisted molecular beam epitaxy (PAMBE), a reduced pressure chemical vapor deposition (RPCVD), an atomic layer deposition (ALD), a plasma enhanced atomic layer deposition (PEALD), a laser molecular beam epitaxy (Laser MBE), a plasma enhanced metal-organic chemical vapor deposition (PEMOCVD), an electron cyclotron resonance plasma enhanced metal-organic chemical vapor deposition (ECR-PEMOCVD), a pulsed laser deposition (PLD) or a magnetron sputtering. The second-type gallium nitride or the ITO in the second-type layer 104 may be formed by adopting the low temperature deposition process, which is conductive to ensuring that the light emitting layer formed by the quantum dot 1031 is not damaged by a high temperature.

In step S150, an electrode layer is formed on the second-type layer.

The electrode layer 105 may, for example, include a transparent conductive oxide, such as ITO, AZO, BZO, which is conducive to ensuring a light extracting rate of the light emitting diode. Exemplarily, a process of forming the electrode layer 105 may be the low temperature deposition process, exemplarily including a magnetron sputtering process and the like, without requiring a high temperature annealing process. In this way, the electrode layer 105 may be formed by adopting the low temperature deposition process, which is conductive to ensuring that the light emitting layer formed by the quantum dot 1031 is not damaged by the high temperature.

In step S160, part of the electrode layer and the second-type layer are removed.

A remaining electrode layer 105 and a remaining second-type layer 104 correspond to the light emitting layer, that is, the second-type layer 104 covers the light emitting layer. A process of removing the part of the electrode layer 105 may be, for example, a wet etching process; and a process of removing the part of the second-type layer 104 may be, for example, a dry etching process.

In step S170, an insulating layer is formed on the electrode layer, a windowing is performed in a position where the insulating layer corresponds to the electrode layer to form a second window; a windowing is performed in a position where a black matrix corresponds to the first-type layer to form a third window.

The insulating layer 106 covers an upper surface of the electrode layer 105, a side surface of the electrode layer 105, and a side surface of the second-type layer 104 to seal and insulate the light emitting layer. The insulating layer 106 may be a film layer having an insulating function or a film layer having both an insulating function and a reflective function, and exemplarily, the insulating layer 106 includes a single-layer reflective layer or a distributed Bragg reflective layer. Exemplarily, a process of forming the insulating layer 106 is a sputtering process, an evaporation process, or a PECVD process. A process of windowing to form the second window may be, for example, the wet etching process or the dry etching process to expose the electrode layer 105; and a process of windowing to form the third window may be, for example, the wet etching process or the dry etching process to expose the first-type gallium nitride.

In S180, a first electrode is formed within the second window, a second electrode is formed within the third window, to form an array motherboard of the light emitting diode.

The first electrode 1071 may be an anode, the second electrode 1072 may be a cathode, and the first electrode 1071 and the second electrode 1072 may provide voltage and current for the light emitting diode; and the two electrodes may have the same or different materials and structures. Exemplarily, the first electrode 1071 and the second electrode 1072 are configured in a coplanar manner, namely, the surfaces of the first electrode 1071 and the second electrode 1072 are consistent in height, so that the bonding of the light emitting diode and a driving circuit board is facilitated, and thus the bonding difficulty of the light emitting diode is reduced. Exemplarily, a process of forming the first electrode 1071 and the second electrode 1072 includes an electron beam evaporation process or a thermal evaporation process.

In step S190, the first-type layer is thinned or the base of the first-type substrate is removed, and the array motherboard is cut, to form an independent light emitting diode.

In a case where the film layer thickness of the first-type layer is larger than the preset value, the first-type layer is thinned; and in a case where the film layer thickness of the first-type layer is less than or equal to the preset value, the base of the first-type substrate is removed, and a process of removing the base includes that: the base is stripped through laser, and the base is dissolved and removed and the like. Exemplarily, a sapphire base may be removed by a laser stripping process, a silicon base may be removed by acid or base erosion, and all types of bases may be removed by a polish process. A process of cutting the array motherboard includes a laser cutting process or an inductively coupled plasma etching (ICP) process to form the independent light emitting diode. It should be noted that execution sequences of the step of thinning the first-type layer or removing the substrate on the first-type substrate and the step of cutting the array motherboard are not limited in the embodiments of the present application.

According to the embodiments of the present application, the second-type layer 104 is formed on the light emitting layer, so that the light emitting layer may be covered by the second-type layer 104. In this way, on one hand, the second-type layer 104 has a good sealing effect on the quantum dot 1031, which is conductive to avoiding the erosion of water vapor and oxygen to the light emitting layer, and therefore to improving the service life and the performance of the quantum dot 1031; and on the other hand, the second-type gallium nitride or the ITO in the second-type layer 104 may be formed by adopting the low temperature deposition process, which is conductive to ensuring that the light emitting layer formed by the quantum dot 1031 is not damaged by the high temperature. In addition, a main body of the light emitting layer is the quantum dot 1031, and a light emitting wavelength of the light emitting layer is only determined by the size of the quantum dot 1031, which is conductive to improving the optical and electrical consistency of the light emitting diode. Therefore, in the embodiments of the present application, not only the optical and electrical consistency of the light emitting diode is improved, but also the erosion of the water vapor and the oxygen to the light emitting layer and the damage of a high-temperature environment to the light emitting layer is avoided, thereby the performance of the light emitting diode is improved.

Figure 7:
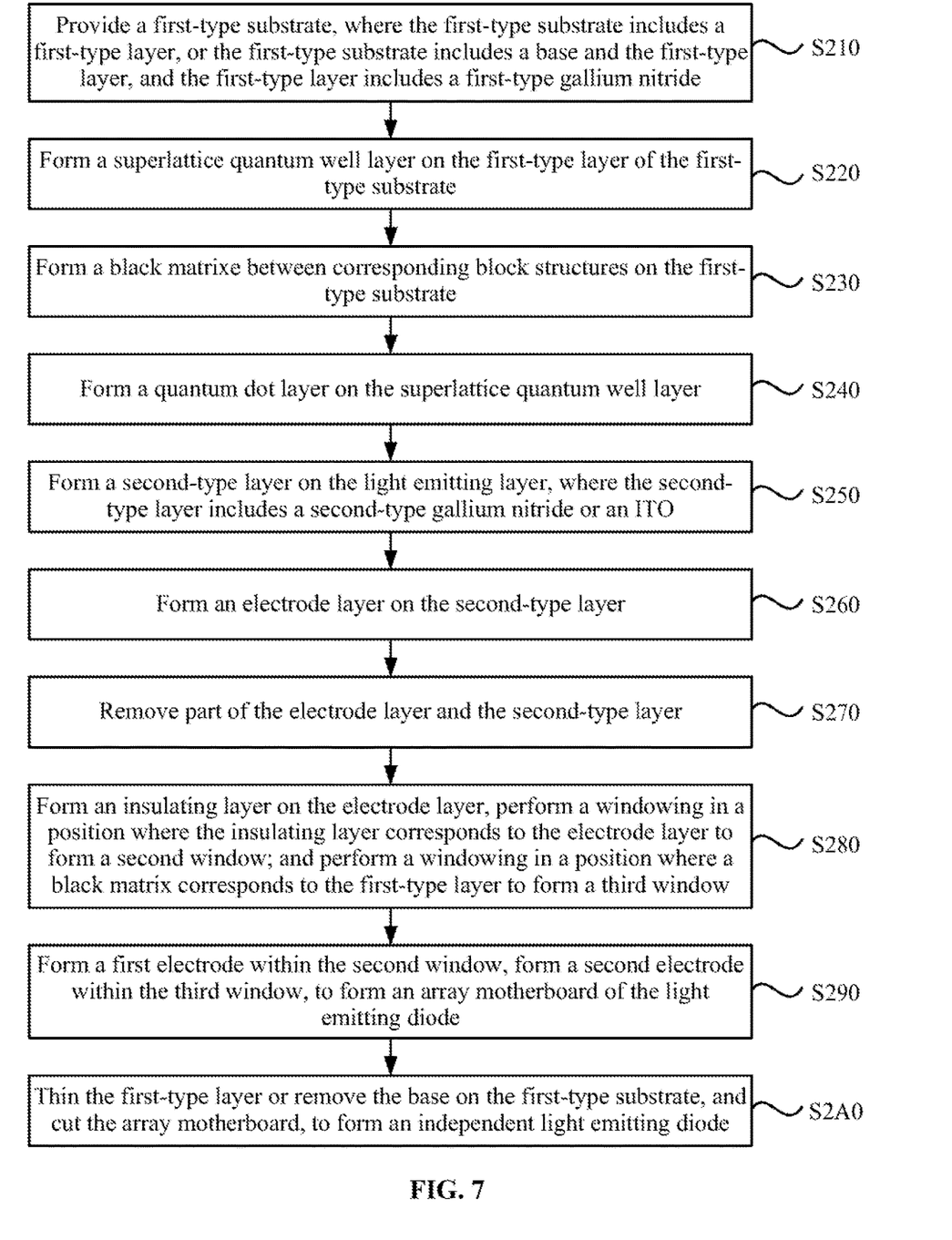
FIG. 7 is a schematic flowchart of another method for manufacturing a light emitting diode provided in an embodiment of the present application.
Figure 8:
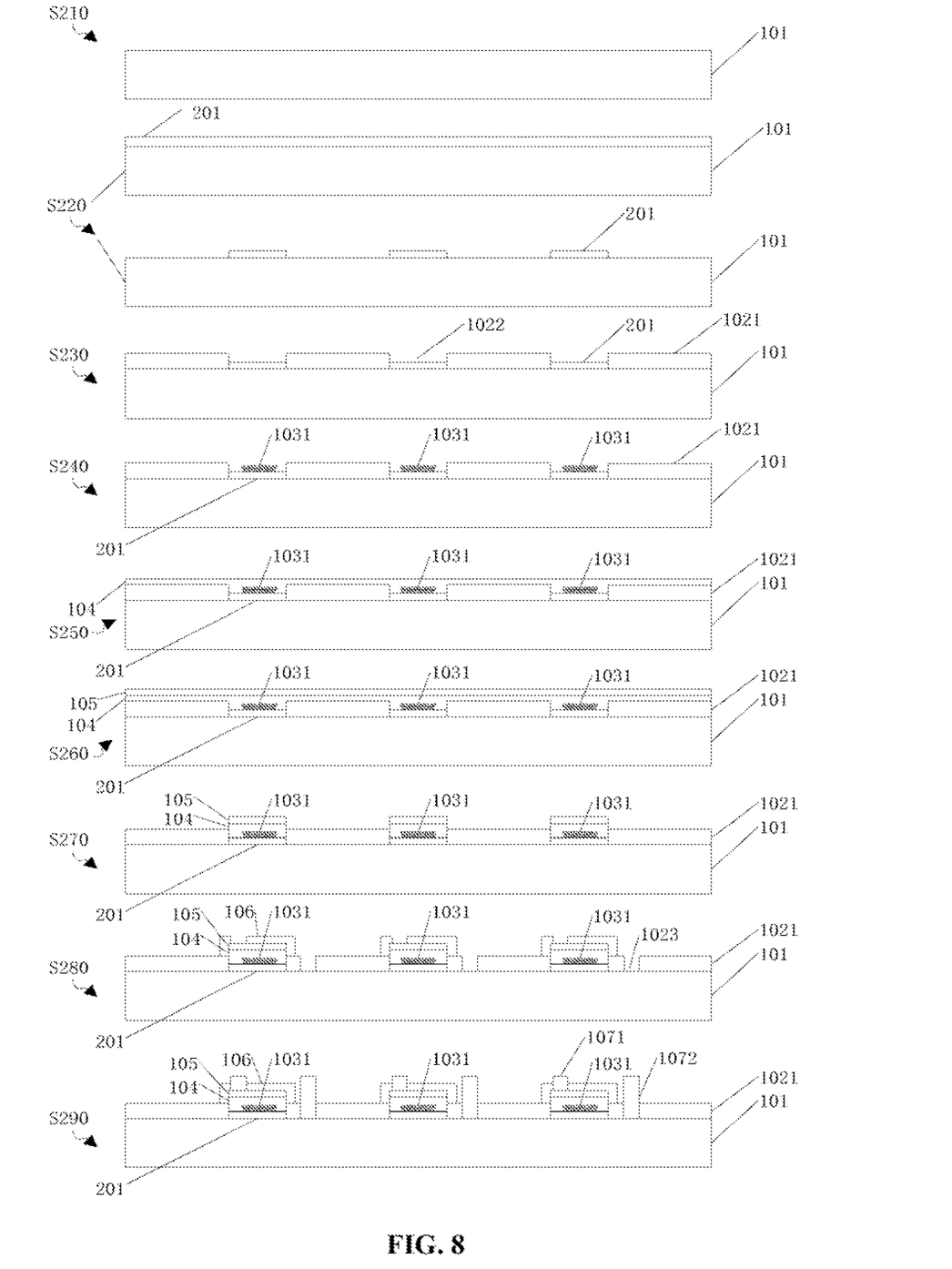
FIG. 8 is a schematic structural diagram of a light emitting diode formed in each step of the method for manufacturing a light emitting diode in FIG. 7.

FIG. 7 is a schematic flowchart of another method for manufacturing a light emitting diode provided in an embodiment of the present application, and FIG. 8 is a schematic structural diagram of a light emitting diode formed in each step of the method for manufacturing a light emitting diode in FIG. 7. Referring to FIGS. 7 and 8, unlike FIG. 5, a structure of a light emitting layer in an embodiment of the present disclosure includes a composite structure of a superlattice quantum well layer 201 and a quantum dot layer. The method for manufacturing this light emitting diode includes steps S210 to S2A0.

In step S210, a first-type substrate is provided, where the first-type substrate includes a first-type layer, or the first-type substrate includes a base and the first-type layer, and the first-type layer includes a first-type gallium nitride.

In step S220, a superlattice quantum well layer is formed on the first-type layer of the first-type substrate.

The superlattice quantum well layer 201 facilitates light mixing of multiple colors. Exemplarily, a process of forming the superlattice quantum well layer 201 includes a MOCVD; then, the superlattice quantum well layer 201 is etched into block structures through a photolithography process or a dry etching process, and each block structure corresponds to one light emitting diode.

In step S230, a black matrix is formed between corresponding block structures on the first-type substrate.

A first window 1022 of the black matrix 1021 is located a position corresponding to the block structure. Exemplarily, a thickness of the black matrix 1021 is greater than a thickness of the superlattice quantum well layer 201 to facilitate the first window 1022 to accommodate the quantum dot layer.

In step S240, a quantum dot layer is formed on the superlattice quantum well layer.

A process of forming the quantum dot layer includes a spin coating process, a printing process, a transfer printing process or a physical vapor deposition process, and the like, where the spin coating process, the printing process, the transfer printing process or the physical vapor deposition process is performed at least once. Thus, a light emitting layer including the superlattice quantum well layer 201 and the quantum dot layer is formed within the first window 1022 of the black matrix 1021. A side surface of the light emitting layer is coated with the black matrix 1021, so that the sealing of the light emitting layer is facilitated, and the sealing performance of the light emitting diode is improved. As can be known form the light-emitting property of the light-emitting layer, a light emitting color of the light emitting layer is determined by the superlattice quantum well layer 201 and the quantum dot layer together. Exemplarily, in a case where the superlattice quantum well layer 201 emits the blue light, and the quantum dot layer emits at least one of red light or green light; in a case where the superlattice quantum well layer 201 emits blue light, and the quantum dot layer includes mixed red and green quantum dots, the light emitting layer emits white light.

In step S250, a second-type layer is formed on the light emitting layer, where the second-type layer includes a second-type gallium nitride or an ITO.

In step S260, an electrode layer is formed on the second-type layer.

In step S270, part of the electrode layer and the second-type layer are removed.

In step S280, an insulating layer is formed on the electrode layer, a windowing is performed in a position where the insulating layer corresponds to the electrode layer to form a second window; and a windowing is performed in a position where a black matrix corresponds to the first-type layer to form a third window.

In step S290, a first electrode is formed within the second window, a second electrode is formed within the third window, to form an array motherboard of the light emitting diode.

In step S2A0, the first-type layer is thinned or the base of the first-type substrate is removed, and the array motherboard is cut, to form an independent light emitting diode.

The first-type is a n-type or a p-type, the second-type is a p-type or a n-type. In a case where the first-type is the n-type, the second-type is the p-type, and in a case where the first-type is the p-type, the second-type is the n-type.

What is claimed is:

1. A light emitting diode, comprising:
    a first-type layer, which comprises a first-type gallium nitride;
    a light emitting layer, which is located on the first-type layer and comprises a quantum dot;
    a second-type layer, which is located on the light emitting layer and comprises an indium tin oxide (ITO);
    an electrode layer, which is located on the second-type layer;
    a black matrix, which is located between the first-type layer and the second-type layer and comprises a first window, and the light emitting layer is located within the first window; and
    an insulating layer, which covers an upper surface of the electrode layer, a side surface of the electrode layer, and a side surface of the second-type layer.

2. The light emitting diode of claim 1, wherein a thickness of the second-type layer is in a range of 20 nm to 300 nm.

3. The light emitting diode of claim 1, wherein the light emitting layer comprises a single-layer quantum dot layer.

4. The light emitting diode of claim 3, wherein the single-layer quantum dot layer emits at least one of red light, green light, or blue light.

5. The light emitting diode of claim 1, wherein the light emitting layer comprises a composite structure of a superlattice quantum well layer and a quantum dot layer.

6. The light emitting diode of claim 5, wherein the superlattice quantum well layer emits blue light, and the quantum dot layer emits at least one of red light or green light.

7. The light emitting diode of claim 3, wherein a thickness of the quantum dot layer is in a range of 2 nm to 20 μm.

8. The light emitting diode of claim 1, wherein the electrode layer comprises the indium tin oxide (ITO).

9. The light emitting diode of claim 1, wherein the insulating layer comprises a second window, and the black matrix comprises a third window;
    wherein the light emitting diode further comprises:
    a first electrode located within the second window; and
    a second electrode located within the third window.

* * * * *